US010110039B2

(12) United States Patent
Sawyers et al.

(10) Patent No.: US 10,110,039 B2
(45) Date of Patent: Oct. 23, 2018

(54) CANCEL VOLTAGE OFFSET OF OPERATIONAL AMPLIFIER

(71) Applicant: HEWLETT-PACKARD DEVELOPMENT COMPANY, L.P., Houston, TX (US)

(72) Inventors: Thomas Sawyers, Houston, TX (US); Jon G Lloyd, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 16 days.

(21) Appl. No.: 15/308,316

(22) PCT Filed: Jun. 30, 2014

(86) PCT No.: PCT/US2014/044942
§ 371 (c)(1),
(2) Date: Nov. 1, 2016

(87) PCT Pub. No.: WO2016/003429
PCT Pub. Date: Jan. 7, 2016

(65) Prior Publication Data
US 2018/0102662 A1    Apr. 12, 2018

(51) Int. Cl.
*H02J 7/00* (2006.01)
*H03F 3/45* (2006.01)

(52) U.S. Cl.
CPC ........ *H02J 7/0072* (2013.01); *H03F 3/45076* (2013.01); *H03F 3/45475* (2013.01); *H03F 3/45973* (2013.01); *H02J 2007/0059* (2013.01)

(58) Field of Classification Search
USPC ........................................................ 320/148
See application file for complete search history.

(56) References Cited

U.S. PATENT DOCUMENTS

| 4,746,854 A | 5/1988 | Baker et al. |
| 5,554,921 A | 9/1996 | Li et al. |
| 5,883,497 A | 3/1999 | Turnbull |

(Continued)

FOREIGN PATENT DOCUMENTS

| CN | 1380743 | 11/2002 |
| EP | 1596497 A1 | 11/2005 |

(Continued)

OTHER PUBLICATIONS

Yarlagadda, A.; "PSoC ® 1 Single Cell Li-Ion Battery Charger with CY8C21x23"; Cypress.Com; Aug. 2, 2012; 20 pages.

*Primary Examiner* — Mohammed Alam
(74) *Attorney, Agent, or Firm* — HPI Patent Department (57) ABSTRACT

A system according to examples of the present disclosure includes a battery charger electrically coupled to a battery and a battery charging circuit. The battery charging circuit includes an operational amplifier having a negative input to receive a pre-bias voltage, a positive input, an output, and a voltage offset. The battery charging circuit also includes a charge controller having an analog-to-digital converter to receive a voltage output from the output of the operational amplifier and a voltage supply to supply a voltage input into the positive input of the operation amplifier to cancel the voltage offset of the operational amplifier. In the example, the voltage output of the charge controller is a function of the voltage input of the charge controller.

15 Claims, 4 Drawing Sheets

(56) References Cited

U.S. PATENT DOCUMENTS

| | | | |
|---|---|---|---|
| 5,945,853 A | 8/1999 | Sano | |
| 6,268,710 B1 | 7/2001 | Koga | |
| 6,377,028 B1 | 4/2002 | Armstrong et al. | |
| 6,577,135 B1 | 6/2003 | Matthews et al. | |
| 6,836,095 B2 | 12/2004 | Fogg | |
| 2002/0130696 A1 | 9/2002 | Yoshizawa | |
| 2004/0212347 A1 | 10/2004 | Fogg | |
| 2005/0099158 A1 | 5/2005 | Matsuda | |
| 2009/0051329 A1* | 2/2009 | Ashida | H02J 7/045 320/164 |
| 2014/0191670 A1* | 7/2014 | Ge | H05B 33/0815 315/186 |
| 2014/0191681 A1* | 7/2014 | Noller | H03K 3/00 315/224 |
| 2014/0266939 A1* | 9/2014 | Baringer | H01Q 21/28 343/729 |
| 2015/0207413 A1* | 7/2015 | Lin | H02M 3/1584 323/271 |
| 2018/0102662 A1* | 4/2018 | Sawyers | H02J 7/0072 |

FOREIGN PATENT DOCUMENTS

| | | |
|---|---|---|
| JP | H0777546 A | 3/1995 |
| JP | 08-168186 | 6/1996 |
| JP | 3182253 B2 | 7/2001 |
| KR | 10-1999-0023245 | 3/1999 |

* cited by examiner

CANCEL VOLTAGE OFFSET OF OPERATIONAL AMPLIFIER

BACKGROUND

Many computing systems such as laptops, tablets, mobile phones, and other similar systems utilize batteries to receive power. As the computing systems function, the batteries are drained. Consequently, the batteries either need to be replaced or recharged from time to time so that the computing systems can continue to function.

BRIEF DESCRIPTION OF THE DRAWINGS

The following detailed description references the drawings, in which.

DETAILED DESCRIPTION

Charging the battery of a computing system such as a laptop, tablet, mobile phone, or other similar system provides mobility and continued usability of the systems. For example, many users of these computer systems utilize such computing systems while away from a steady power source. However, the batteries drain over time as a result of use of the systems. As such, the batteries need to be recharged from time to time.

To recharge the battery for a computing system, it may be desirable to send a known current through the battery. In this way, the battery may be charged at a preferred rate. That is, the battery may be charged as fast as possible without degrading the battery. If the battery is charged too quickly, the integrity of the battery may be compromised, causing the battery to experience a failure, a shortened usable lifespan, or a catastrophic event. However, charging the battery too slowly is inconvenience for the user of the computing system because the user cannot use the system until the battery is recharged (at least partially).

Currently, computing systems may implement operational amplifiers to regulate the battery charging voltage or current. For example, computing systems may implement an error correcting circuit having an operational amplifier in which a reference signal is fed into the positive terminal of the operational amplifier and a feedback signal is fed into the negative terminal of the operational amplifier. However, the voltage offset inherent in operational amplifiers result in less than ideal battery charging current control. Previous solutions include utilizing a more expensive, low-offset operational amplifier or a more expensive, dedicated current sense amplifier to provide an optimal charge to a battery. In addition to being expensive, the voltage offset of the operational amplifiers may vary with age and/or operating conditions. Other implementations for providing an optimal battery charge may utilize an existing calibration method to characterize the amplifier by electrically disconnecting it from the intended application, connecting and applying a test signal, recording results, and reconnecting it to the intended application. However, this approach requires either the inclusion of extra switches and control signals on a computing system's printed circuit assembly (PCA), or a special in-circuit test process during manufacture that is enabled by additional PCA components.

Various implementations are described below by referring to several examples of regulating battery charge current by generating a signal bias to cancel the voltage offset of a current regulator using an embedded controller. A system according to examples of the present disclosure includes a battery charger electrically coupled to a battery and a battery charging circuit. The battery charging circuit includes an operational amplifier having a negative input to receive a pre-bias voltage, a positive input, an output, and a voltage offset. The battery charging circuit also includes a charge controller having an analog-to-digital converter to receive a voltage output from the output of the operational amplifier and a voltage supply to supply a voltage input into the positive input of the operational amplifier to cancel the voltage offset of the operational amplifier. In the example, the voltage output of the charge controller is a function of the voltage input of the charge controller.

The techniques described herein enable very accurate regulation using low-cost operational amplifiers. Moreover, small charge currents can be accurately controlled using the low-cost operational amplifiers. These and other advantages will be apparent from the description that follows.

Figure 1:
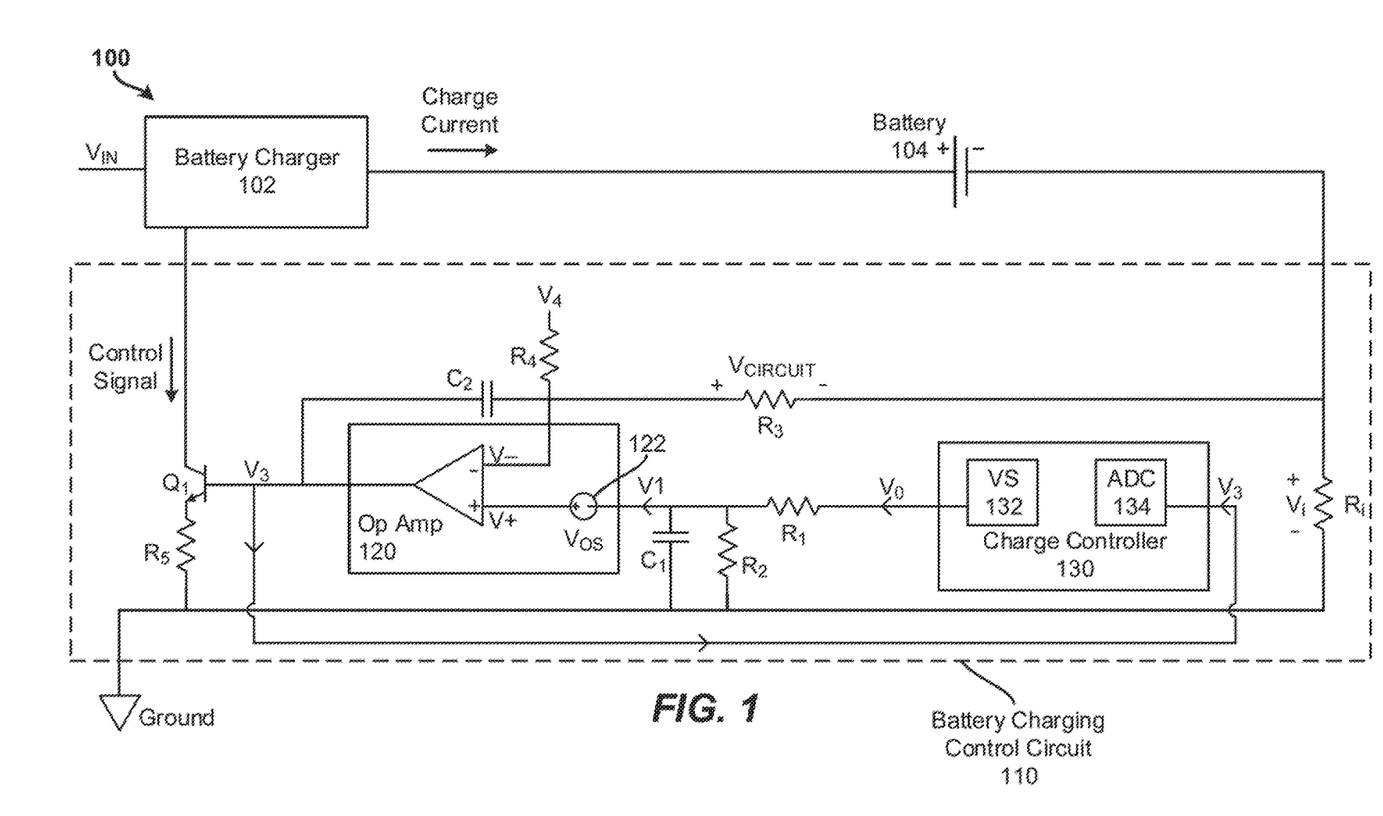
FIG. 1 illustrates a block diagram of a circuit for regulating battery charge current for a computing system by generating a signal bias to cancel the voltage offset of an operational amplifier using a charge controller according to examples of the present disclosure.

FIG. 1 illustrates a block diagram of a circuit 110 for regulating battery charge current for a computing system 100 by generating a signal bias to cancel the voltage offset $V_{OS}$ of an operational amplifier 120 using a charge controller 130 according to examples of the present disclosure. FIG. 1 includes particular components, modules, etc. according to various examples. However, in different implementations, more, fewer, and/or other components, modules, arrangements of components/modules. etc. may be used according to the teachings described herein. In addition, various components, modules, etc. described herein may be implemented as one or more software modules, hardware modules, special-purpose hardware (e.g., application specific hardware, application specific integrated circuits (ASICs), embedded controllers, hardwired circuitry, etc.), or some combination of these.

It should be understood that the computing system 100 may include any appropriate type of computing device, including for example smartphones, tablets, desktops, laptops, workstations, servers, smart monitors, smart televisions, digital signage, scientific instruments, retail point of sale devices, video walls, imaging devices, peripherals, or the like.

In the example shown in FIG. 1, the computing system 100 includes a battery charger 102 electrically coupled to a battery 104 and a battery charging control circuit 110. The battery charger 102 may represent any appropriate variety of battery charger typically associated with charging batteries such as battery 104. The battery charger receives a voltage input $V_{IN}$ such as by plugging the battery charger 102 into an electrical outlet or other suitable power source. The battery charger 102 then supplies a charge current to the battery 104, which in turn supplies power to the computing system 100.

The battery charging control circuit 110 regulates the charge current supplied by the battery charger 102 to the battery 104 through a control signal. By regulating the charge current supplied to the battery 104, the battery may be optimally charged. That is, the battery 104 may be charged at the fastest rate possible that remains advantageous to the integrity of the battery 104.

The battery charging control circuit 110 includes an operational amplifier (or "op amp") 120, a charge controller 130 and an assortment of resistors, capacitors, and voltage sources as shown in FIG. 1. During calibration, the battery charging control circuit 110 operates by applying a pre-bias voltage $V_4$ through $R_4$ as an input signal into the negative terminal of op amp 120 as the reference signal and by applying a programmable reference $V_0$ as the feedback signal into the positive input of the op amp 120. When regulation is achieved, the final value of voltage $V_0$ may be stored within the charge controller 130 as a voltage bias value. The voltage bias value is then applied during charging to cancel the voltage offset $V_{OS}$ of the op amp 120 and the effect of the pre-bias voltage $V_4$ through $R_4$, and thus the voltage bias of the battery charging control circuit 110.

Current sensing utilizes a low-value current sense resistor $R_i$ to generate a voltage signal from the charge current without dissipating much power. This signal is the amplified to produce a signal that is large enough to be used. An example is shown in the battery charging control circuit 110 of FIG. 1. The charge current passes through sense resistor $R_i$, which generates a sense voltage $V_i$. The sense voltage $V_i$ is fed back into the op amp 120 through $R_3$, where it is compared to voltage $V_1$, which may be a smaller voltage derived from a larger voltage $V_0$.

When charging, the voltage $V_1$ is set by the output voltage $V_0$ of a programmable digital-to-analog converter (DAC) or by a programmable pulse width modulator (PWM) signal collectively referred to as voltage supply (VS) 132, which is contained within the charge controller 130. Capacitor $C_1$ filters the PWM signal, in examples, into a direct current average. The op amp 120 senses the feedback voltage $V_i$ through $R_3$ at the negative input of the op amp 120 (V−), and compares it to the reference voltage $V_1$ at the positive input (for example) of the op amp 120 (V+). The voltage difference between the positive and negative terminals of the op amp 120 (V+) and (V−) is amplified and output as voltage $V_3$, which drives other elements (e.g., transistor $Q_1$ and resistor $R_5$) to control the charging current. Resistor $R_3$ and capacitor $C_2$ control the amount, and frequency response, of the amplification performed by op amp 120. If the feedback $V_i$ is greater than the reference $V_1$, then $V_3$ is reduced, which reduces the charge current, which reduces $V_i$, thus regulating $V_i$ virtually equal to $V_1$. Consequently, the charge current is regulated to the desired value (i.e., to a value that promotes fast battery charging while reducing any negative effects on the battery).

The op amp 120 also includes a voltage offset $V_{OS}$ which acts as a small direct current error inside the amplifier. Such an error is common within operational amplifiers and can vary depending on the manufacturing processes and tolerances used to manufacture the op amp, the operating conditions of the op amp, the age of the op amp, and combinations of these and other factors. If the feedback signal is small, such as the small voltage across a current sense resistor $R_i$, the $V_{OS}$ causes the op amp to regulate to the wrong level.

To accomplish this and to permit calibration of the battery charging control circuit 110, a pre-bias voltage $V_4$ is passed through resistor $R_4$ into the negative terminal (V−) of the op amp 120. In examples, $V_4$ may be an existing 5V or 3.3V voltage rail or other suitable voltage source. The pre-bias voltage $V_4$ may be greater than half the range of the voltage offset of the op amp 120. For example, if the range of the voltage offset of the op amp 120 is +/−9 millivolts, the pre-bias voltage $V_4$ as it is received at the negative terminal (V−) of the op amp 120 through resistor $R_4$ is greater than 9 millivolts. This enables the negative terminal (V−) of the op amp 120 to receive a positive voltage current offset that is greater than the op amp offset $V_{OS}$.

In an example, a voltage offset $V_{OS}$ of an op amp such as op amp 120 may be +/−9 mV. In this example, a voltage $V_4$ is passed through resistor $R_4$, which causes a current to be sent into resistor $R_3$, causing a circuit offset voltage $V_{CIRCUIT}$, equal to the voltage drop across resistor $R_3$. The values of voltage $V_4$ and resistor $R_4$ are chosen to make $V_{CIRCUIT} > V_{OS}$. Therefore, when charge current is zero, $V_i$ is zero, the charge controller 130 output $V_0$ is zero, $V_1$ is zero, (V+) is equal to $V_{OS}$, (V−) is equal to $V_{CIRCUIT}$, and (V−) is greater than (V+), so $V_3$ decreases to zero. At this point, the battery charging control circuit 110 may begin calibration to calculate a value for $V_0$ that will produce a correct bias that can be applied to cancel out the voltage offset $V_{OS}$ of the op amp 120.

The charge controller 130 also includes an analog-to-digital converter (ADC) 134, which is used during calibration to sense the output $V_3$ of op amp 120. When battery charging is enabled, the calibration routine is run first, before charging begins. During calibration, there is no charge current, so $V_3$ is zero. The negative input (V−) of the op amp 120 is set by $V_4$, $R_4$, and $R_3$ as $(V-)=V_4 \times R_3/(R_3+R_4)=V_{CIRCUIT}$. Next, the charge controller 130 enters a calibration cycle (shown in detail in FIG. 4), and uses the op amp 120 output voltage $V_3$ to set $V_0$, according to the following formula: $V_0=K_1-(K_2 \times V_3)$, where $K_1$ and $K_2$ are constants. In an example, during calibration, $V_0$ and $V_3$ are each limited within a defined operational range.

Figure 2:
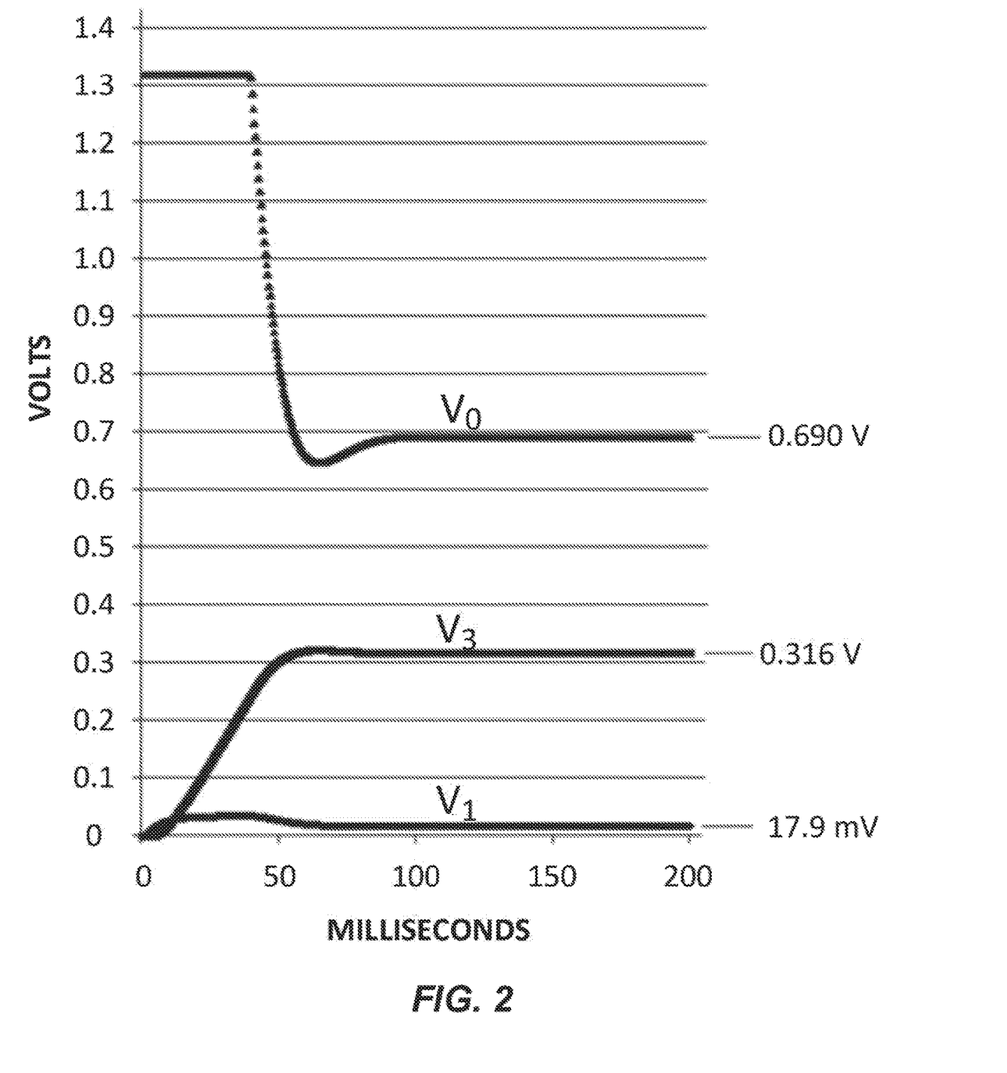
FIG. 2 illustrates a plot of the calibrated circuit offset bias according to examples of the present disclosure.

Initially, $V_3$ is zero, so $V_0$ steps up to voltage $K_1$. This charges capacitor $C_1$, and consequently $V_1$ increases toward a voltage $V_1=V_0 \times R_2/(R_1+R_2)$. This $V_1$ is summed with Vos to make (V+)=V1+Vos. The op amp 120 then amplifies the difference between the positive and negative terminals (V+) and (V−), resulting in output $V_3$. As (V+) begins to exceed (V−). $V_3$ rises, but the rate of rise is slowed by capacitor $C_2$. As $V_3$ in turn rises, the charge controller 130 samples $V_3$; when V3 rises within a certain range, the charge controller 130 sets $V_0$ lower, which lowers $V_1$. The circuit time constants are set such that the op amp output $V_3$ settles into regulation to a steady state value, which cancels the total offset (circuit offset plus $V_{OS}$). The voltage versus time plots of $V_0$, $V_1$, and $V_3$ are illustrated in FIG. 2.

In this condition, the steady state output from the charge controller 130 ($V_0$), is the value needed to cancel $V_{CIRCUIT}+V_{OS}$, the circuit and op amp offsets (which are equal to $V_1$). This value of $V_0$ is stored in a memory of the charge controller (not shown), and calibration of the battery charging control circuit 110 is complete. In examples, $V_3$ may be prevented from rising high enough to turn on transistor $Q_1$, thus preventing any incidental battery charging during the calibration process.

During the calibration process, the op amp 120 is configured as an error amplifier, just as when used as a current regulator, except that the functions of the inputs (V+) and (V−) are inverted as shown in FIG. 1. The op amp 120 senses the feedback voltage $V_1$ at (V+), and compares it to the reference voltage $V_4 \times R_3/(R_3+R_4)$ at (V−). The voltage difference between terminals (V+) and (V−) is amplified and output as voltage $V_3$, which drives other elements to control the voltage $V_1$. The charge controller 130, resistor $R_1$, resistor $R_2$, and capacitor $C_1$ control the amount, and frequency response, of the amplification by the op amp 120. Because this feedback is input to the (V+) terminal of the op amp, the procedure provides the phase reversal to cause the negative feedback needed to achieve regulation. If the feedback $V_1$ is greater than the reference (V−), then $V_3$ is increased so that the charge controller 130 causes $V_0$ to be reduced. This in turn reduces $V_1$, thus regulating $V_1$ to virtually equal (V−), which equals the circuit and op amp offsets. This process measures the total offset voltage and identifies the steady state value of $V_0$ needed to cancel the effects of the battery charging control circuit's 110 offsets. In this manner, the op amp 120 automatically identifies the offset voltage of the battery charging control circuit 110 and op amp 120.

After calibration of the battery charging control circuit 110, the battery charging begins. The stored value $V_0$ is used as a fixed offset term (a voltage bias value) to set the charge current. The charge controller 130 output $V_0$ is set equal to a constant $K_3$ times the desired charge $(I_d)$ current plus the stored voltage bias value (e.g., $(K_3 \times I_d)+V_{bias}$). In this way, a battery charging current is supplied to the battery 104 via the battery charger 102 responsive to the battery charger receiving a control signal representative of the voltage from the battery charging circuit.

FIG. 2 illustrates a plot of the calibrated circuit offset bias according to examples of the present disclosure. In the example shown, voltage $V_0$ starts out at an initial value of 1.32 volts and remains constant for the first 40-50 milliseconds as capacitor $C_1$ is charging. Meanwhile, during an approximately similar period of time, capacitor $C_2$ is charging as shown by the plot of $V_1$. Once capacitor $C_1$ is charged, the voltage $V_0$ drops to a steady value of 17.9 millivolts. During the charging time of the capacitors $C_1$ and $C_2$, the output of the op amp $V_3$ gradually rises as $V_0$ decreases. Between the roughly 80-100 millisecond range, $V_3$ begins to stabilize, which is reflected by $V_0$ stabilizing. In this example, the value of $V_0$ represents a voltage bias value of 0.69 volts. It should be understood that the values and plots shown in the example of FIG. 2 are merely intended as being one possible example implementation of the techniques described herein and should not be construed as limiting.

Figure 3:
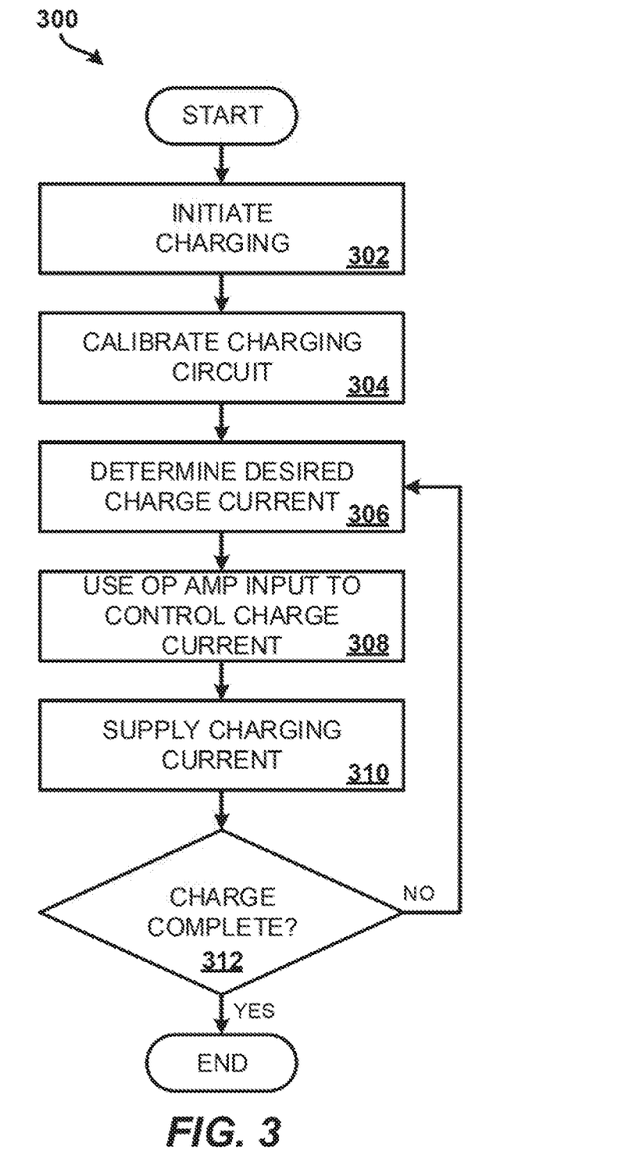
FIG. 3 illustrates a flow diagram of a method for regulating battery charging current according to examples of the present disclosure.

FIG. 3 illustrates a flow diagram of a method for regulating battery charging current according to examples of the present disclosure. The method 300 may be executed by a computing system such as computing system 100 of FIG. 1 or may be stored as instructions on a non-transitory computer-readable storage medium that, when executed by a processor, cause the processor to perform the method 300. In one example, method 300 may include: initiating a battery charging (block 302); calibrating a battery charging circuit (304); determining a desired charge (306); using a voltage input to an op amp to control charge current (block 308); supply battery charging current (block 310); and determining whether the charge is complete (block 312).

At block 302, the method 300 includes initiating a battery charging. Battery charging may be initiated, for example, by a battery charger (e.g. battery charger 102 of FIG. 1) of a computing system (e.g., computing system 100 of FIG. 1) being plugged into a power source (e.g., $V_{IN}$ of FIG. 1). The method 300 continues to block 304.

At block 304, the method 300 includes calibrating a battery charging circuit. The calibration process is described below with reference to FIG. 4. Generally, the calibration process may include reading an output voltage of an op amp (block 402 of FIG. 4); determining whether the output voltage is stable (block 404 of FIG. 4); adjusting the input value of the op amp when the output voltage is not stable (block 406 of FIG. 4); and storing the input voltage value as a voltage bias value when the output voltage is stable (block 408 of FIG. 4).

The battery charging circuit, in examples, may include an operational amplifier having a negative input to receive a pre-bias voltage, a positive input, an output, and a voltage offset. The battery charging circuit may further include a charge controller having an analog-to-digital converter to receive a voltage output from the output of the operational amplifier and a voltage supply to supply a voltage input into the positive input of the operational amplifier, wherein the voltage input is a function of the voltage input. The voltage supply may be a digital-to-analog converter in some examples or a pulse width modulator in other examples. The method 300 continues to block 306.

At block 306, the method 300 includes determining a desired charge current for the battery charging circuit. The method 300 continues to block 308.

At block 308, the method 300 includes using op amp voltage input to apply the desired charge current to regulate the charge current to the battery charger (e.g., battery 102 of FIG. 1). The method continues to block 310.

At block 310, the method 300 includes supplying a battery charging current to the battery. For example, the battery charger 102 may supply a battery charge current to a battery (e.g., battery 102 of FIG. 1), with the charge current being dependent upon the battery charging circuit calibration and voltage bias value. The method continues to block 312.

At block 312, the method 300 includes determining whether the charge is complete, and if the charge is not complete, the method 300 returns to block 306 to determine the desired charge and continue charging the battery (e.g., battery 104 of FIG. 1). If the charge is complete, the battery charger (e.g., battery charger 102) discontinues charging the battery (e.g., battery 104 of FIG. 1).

Additional processes also may be included, and it should be understood that the processes depicted in FIG. 3 represent illustrations, and that other processes may be added or existing processes may be removed, modified, or rearranged without departing from the scope and spirit of the present disclosure.

Figure 4:
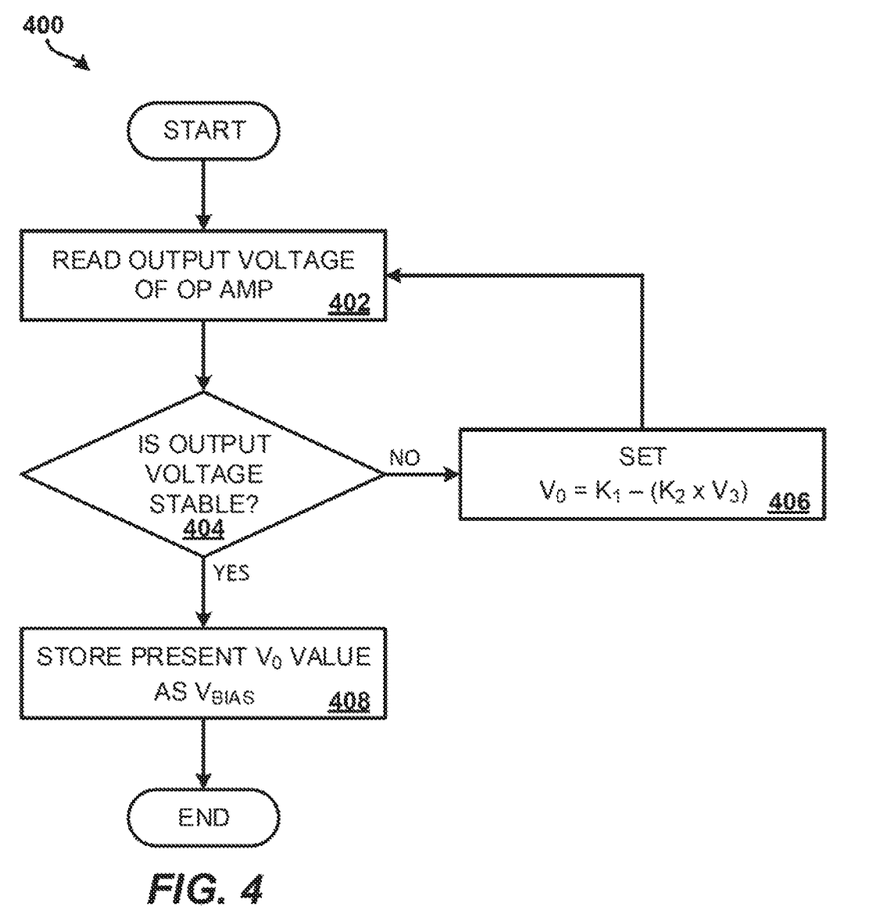
FIG. 4 illustrates a flow diagram of the calibration process of the method for regulating current of FIG. 3 according to examples of the present disclosure.

FIG. 4 illustrates a flow diagram of the calibration process of the method for regulating current in a circuit such as the battery charging circuit of FIG. 3 according to examples of the present disclosure. The method 400 may be executed by a computing system such as computing system 100 of FIG. 1 or may be stored as instructions on a non-transitory computer-readable storage medium that, when executed by a processor, cause the processor to perform the method 400. In one example, method 400 may include: reading an output voltage of an op amp (block 402); determining whether the output voltage is stable (block 404); adjusting the input value of the op amp when the output voltage is not stable (block 406); and storing the input voltage value as a voltage bias value when the output voltage is stable (block 408).

At block 402, the method 400 includes reading an output voltage of an op amp (e.g., op amp 120 of FIG. 1). For example, a computing system (e.g., computing system 100 of FIG. 1) may read a voltage output (e.g., voltage $V_3$ of FIG. 1) using an analog-to-digital converter of the computing system (e.g. ADC 134 of charge controller 130 of FIG. 1). The method 400 continues to block 404.

At block 404, the method 400 includes determining whether the output voltage is stable. For example, responsive to determining that the voltage output from the operational amplifier in a current regulating circuit is not stable, the computing system (e.g., computing system 100 of FIG.

1) inputs a voltage input (e.g., voltage $V_0$ of FIG. 1) into the operational amplifier (e.g., op amp 120 of FIG. 1) in the current regulating circuit equal to a first constant value minus the voltage output times a second constant value until the voltage output is stable (block 406). The voltage input may be generated by a digital-to-analog converter in some examples or by a pulse width modulator in other examples (e.g., voltage source 132 of the charge controller 130 of FIG. 1). The stable voltage output may not be limited or clamped by the output voltage range of the op amp in some examples. The method 400 continues to block 408.

At block 408, the method 400 includes storing the input value of the op amp when the output voltage is stable. For example, responsive to determining that the voltage output from the operational amplifier in the current regulating circuit is stable, the computing system (e.g., computing system 100 of FIG. 1) stores the voltage output (e.g., voltage $V_3$ of FIG. 1) as a voltage bias value, which may be utilized in a current regulating circuit (e.g. battery charging control circuit 110 of FIG. 1) to cancel an offset voltage in the operational amplifier.

Additional processes also may be included. For instance, it may again be determined whether the voltage output from the operational amplifier in the battery charging circuit is stable responsive to inputting the voltage input into the operational amplifier. It should be understood that the processes depicted in FIG. 4 represent illustrations, and that other processes may be added or existing processes may be removed, modified, or rearranged without departing from the scope and spirit of the present disclosure.

It should be emphasized that the above-described examples are merely possible examples of implementations and set forth for a clear understanding of the present disclosure. Many variations and modifications may be made to the above-described examples without departing substantially from the spirit and principles of the present disclosure. Further, the scope of the present disclosure is intended to cover any and all appropriate combinations and sub-combinations of all elements, features, and aspects discussed above. All such appropriate modifications and variations are intended to be included within the scope of the present disclosure, and all possible claims to individual aspects or combinations of elements or steps are intended to be supported by the present disclosure.

What is claimed is:

1. A method comprising:
   determining, by a computing system, whether a voltage output from an operational amplifier in a current regulating circuit is stable, wherein stability is determined by whether the voltage output changes at a rate beyond a predetermined operational level desired for a rechargeable battery, the voltage being read by an analog-to-digital converter of the computing system, wherein the operational amplifier having a negative input to receive a pre-bias voltage, a positive input, an output, and a voltage offset, and wherein the pre-bias voltage received at the negative input of the operational amplifier is greater than half the range of the voltage offset of the operational amplifier;
   responsive to determining that the voltage output from the operational amplifier in the current regulating circuit is not stable, inputting, by the computing system, a voltage input into the operational amplifier in the current regulating circuit equal to a first constant value minus the voltage output times a second constant value until the voltage output is stable; and
   responsive to determining that the voltage output from the operational amplifier in the current regulating circuit is stable, storing, by the computing system, the voltage output value as a voltage bias value to cancel an offset of the current regulating circuit.

2. The method of claim 1, wherein the current regulating circuit is a battery charging circuit.

3. The method of claim 1, wherein the voltage input is generated by a digital-to-analog converter.

4. The method of claim 1, wherein the voltage input is generated by a pulse width modulator.

5. The method of claim 1, further comprising:
   responsive to inputting the voltage input into the operational amplifier, determining, by the computing system, whether the voltage output from the operational amplifier is stable.

6. A computing system comprising:
   a battery charger electrically coupled to a battery and a battery charging circuit, the battery charging circuit further comprising:
      an operational amplifier having a negative input to receive a pre-bias voltage, a positive input, an output, and a voltage offset, wherein the pre-bias voltage received at the negative input of the operational amplifier is greater than the half the range of the voltage offset of the operational amplifier; and
      a charge controller having an analog-to-digital converter to receive a voltage output from the output of the operational amplifier and a voltage supply to supply a voltage input into the positive input of the operation amplifier to cancel the voltage offset of the operational amplifier,
      wherein the charge controller determines whether the voltage output from the operational amplifier in the battery charging circuit is stable, wherein stability is determined by whether the voltage output changes at a rate beyond a predetermined operational level desired for a rechargeable battery, and
      wherein the voltage output of the charge controller is a function of the voltage input of the charge controller.

7. The system of claim 6, wherein the voltage supply is a digital-to-analog converter.

8. The system of claim 6, wherein the voltage supply is a pulse width modulator.

9. A method, comprising:
   initiating, by a computing system, a battery charging for a rechargeable battery;
   calibrating, by the computing system, a battery charging circuit, the battery charging circuit further comprising:
      an operational amplifier having a negative input to receive a pre-bias voltage, a positive input, an output, and a voltage offset, wherein the pre-bias voltage received at the negative input of the operational amplifier is greater than the half the range of the voltage offset of the operational amplifier, and
      a charge controller having an analog-to-digital converter to receive a voltage output from the output of the operational amplifier and a voltage supply to supply a voltage input into the positive input of the operation amplifier, wherein the charge controller determines whether the voltage output from the operational amplifier in the battery charging circuit is stable, wherein stability is determined by whether the voltage output changes at a rate beyond a predetermined operational level desired for the rechargeable battery;

determining, by the computing system, a desired charge current for the battery charging circuit;

applying, by the computing system, the desired charge current to the battery charging circuit to cancel the voltage offset of the battery charging circuit; and supplying, by the computing system, a battery charging current to the battery.

10. The method of claim 9, wherein the voltage output of the charge controller is a function of the voltage input of the charge controller.

11. The method of claim 9, further comprising:
determining, by the computing system, whether the battery charging is complete.

12. The method of claim 11, further comprising:
responsive to determining that the battery charging is not complete, determine a desired current charge for the battery charging circuit;

apply the voltage to control the battery charging current; and supply the battery charging current to the battery.

13. The method of claim 9, wherein the voltage supply is a digital-to-analog converter.

14. The method of claim 9, wherein the voltage supply is a pulse width modulator.

15. The method of claim 9, comprising calibrating the battery charging circuit to determine a level of battery charging current to supply to the rechargeable battery.

* * * * *